United States Patent
Goodwin-Johansson (10) Patent No.: US 6,456,420 B1
(45) Date of Patent: Sep. 24, 2002

(54) MICROELECTROMECHANICAL ELEVATING STRUCTURES

(75) Inventor: Scott Halden Goodwin-Johansson, Pittsboro, NC (US)

(73) Assignee: MCNC, Research Triangle Park, NC (US)

( * ) Notice: Subject to any disclaimer, the term of this patent is extended or adjusted under 35 U.S.C. 154(b) by 58 days.

(21) Appl. No.: 09/626,725

(22) Filed: Jul. 27, 2000

(51) Int. Cl.[7] ............................ G02B 26/00; H01G 5/00
(52) U.S. Cl. ........................ 359/291; 359/298; 361/277; 333/246
(58) Field of Search ................................. 359/290–298; 333/101, 33, 105, 202, 262, 263, 246; 338/92, 96, 97, 200–202; 330/66; 361/277, 278, 281, 287, 292

(56) References Cited

U.S. PATENT DOCUMENTS

| | | | |
|---|---|---|---|
| 4,789,803 A | | 12/1988 | Jacobsen et al. ............ 310/309 |
| 4,811,246 A | | 3/1989 | Fitzgerald, Jr. et al. ..... 702/117 |
| 5,179,499 A | | 1/1993 | MacDonald et al. ........ 361/313 |
| 5,536,988 A | | 7/1996 | Zhang et al. ................ 310/309 |
| 5,602,955 A | | 2/1997 | Haake ......................... 385/136 |
| 5,606,635 A | | 2/1997 | Haake ........................... 385/53 |
| 5,722,989 A | | 3/1998 | Fitch et al. .................. 606/205 |
| 5,867,302 A | * | 2/1999 | Fleming ...................... 359/291 |
| 5,870,007 A | | 2/1999 | Carr et al. ................... 333/262 |
| 5,870,518 A | | 2/1999 | Haake et al. .................. 385/90 |
| 5,881,198 A | | 3/1999 | Haake ......................... 385/136 |
| 5,962,949 A | | 10/1999 | Dhuler et al. ............... 310/307 |
| 6,067,183 A | * | 5/2000 | Furlani et al. .............. 359/254 |
| 6,127,908 A | * | 10/2000 | Bozler et al. ............... 333/246 |
| 6,175,443 B1 | * | 1/2001 | Aksyuk et al. ............. 359/291 |
| 6,222,706 B1 | * | 4/2001 | Stefansky et al. ........ 360/294.5 |
| 6,229,683 B1 | * | 5/2001 | Goodwin-Johansson .... 361/233 |
| 6,229,684 B1 | * | 5/2001 | Cowen et al. .............. 361/278 |
| 6,233,088 B1 | * | 5/2001 | Roberson et al. .......... 359/291 |
| 6,236,491 B1 | * | 5/2001 | Goodwin-Johansson .... 359/291 |
| 6,239,685 B1 | * | 5/2001 | Albrecht et al. ............ 337/365 |
| 6,275,325 B1 | * | 8/2001 | Sinclair ....................... 359/291 |
| 6,396,677 B1 | * | 5/2002 | Chua et al. ................. 361/277 |

FOREIGN PATENT DOCUMENTS

WO    WO99/24783    5/1999

* cited by examiner

*Primary Examiner*—Evelyn A Lester
(74) *Attorney, Agent, or Firm*—Alston & Bird LLP (57) ABSTRACT

A MEMS apparatus is provided that includes a microelectronic substrate and an elevating structure having a fixed portion attached to the substrate and a distal portion raised from the surface of the substrate. The distal portion of the elevating structure defines at least one zone of attachment. Additionally, the MEMS apparatus comprises a MEMS device attached to the distal portion of the elevating structure at one of the zones of attachment. The attached MEMS device may comprise an electrostatic actuator having a first and second electrode film that are attached to the elevating structure at one of the zones of attachment. In those embodiments in which the MEMS devices comprise an electrostatic actuator the force and movement provided by the actuator may be used to incorporate switches, pumps, valves or other similar MEMS devices.

67 Claims, 8 Drawing Sheets

MICROELECTROMECHANICAL ELEVATING STRUCTURES

FIELD OF THE INVENTION

The present invention relates to microelectromechanical system (MEMS) devices, and more particularly to elevating structures that allow for MEMS devices to be spatially positioned in diverse orientations with respect to the microelectronic substrate.

BACKGROUND OF THE INVENTION

Advances in thin film technology have enabled the development of sophisticated integrated circuits. This advanced semiconductor technology has also been leveraged to create MEMS (Micro Electro Mechanical System) structures. MEMS structures are typically capable of motion or applying force. Many different varieties of MEMS devices have been created, including microsensors, microgears, micromotors, and other microengineered devices. MEMS devices are being developed for a wide variety of applications because they provide the advantages of low cost, high reliability and extremely small size.

Design freedom afforded to engineers of MEMS devices has led to the development of various techniques and structures for providing the force necessary to cause the desired motion within microstructures. For example, microcantilevers have been used to apply rotational mechanical force to rotate micromachined springs and gears. Electromagnetic fields have been used to drive micromotors. Piezoelectric forces have also been successfully been used to controllably move micromachined structures. Controlled thermal expansion of actuators or other MEMS components has been used to create forces for driving microdevices. One such device is found in U.S. Pat. No. 5,475,318 entitled "Microprobe" issued Dec. 12, 1995 in the name of inventors Marcus et al., which leverages thermal expansion to move a microdevice. A micro cantilever is constructed from materials having different thermal coefficients of expansion. When heated, the bimorph layers arch differently, causing the micro cantilever to move accordingly. A similar mechanism is used to activate a micromachined thermal switch as described in U.S. Pat. No. 5,463,233 entitled "Micromachined Thermal Switch" issued Oct. 31, 1995 in the name of inventor Norling.

Electrostatic forces have also been used to move structures. Traditional electrostatic devices were constructed from laminated films cut from plastic or mylar materials. A flexible electrode was attached to the film, and another electrode was affixed to a base structure. Electrically energizing the respective electrodes created an electrostatic force attracting the electrodes to each other or repelling them from each other. A representative example of these devices is found in U.S. Pat. No. 4,266,339 entitled "Method for Making Rolling Electrode for Electrostatic Device" issued May 12, 1981 in the name of inventor Kalt. These devices work well for typical motive applications, but these devices cannot be constructed in dimensions suitable for miniaturized integrated circuits, biomedical applications, or MEMS structures.

In conventional MEMS devices, such as thermal bimorphs and flexible electrostatic actuators, the devices have been directly attached to the underlying microelectronic substrate. Such direct attachment limits the orientation of the resulting motion or force and limits the complexity of devices that can be deposited on any one substrate. Recent improvements in MEMS devices have led to more robust structures, capable of imparting greater force and greater degrees of actuation. In many applications numerous MEMS devices have been fabricated in array-like fashion on the microelectronic substrate to further leverage these improvements. However, in instances where the MEMS devices are attached directly to the substrate the complexity of the array formation is limited to the available area on the surface of the substrate.

To alleviate this problem what is desired is a structure that can serve to elevate the point of attachment above the surface of the substrate. Such an innovation would allow the point of attachment to exist in any plane of orientation in respect to the underlying substrate. In this regard, the corresponding MEMS devices that are attached at these elevated points of attachment can impart force and motion in a myriad of directions. By providing for the capability to raise the point of attachment above the substrate MEMS optical attenuators can be developed that allow for optical beam deflection proximate the substrate while maintaining ample spacing between the optical beam and the substrate. In this manner, light tables could be created with the path of the beam determined by multiple actuators capable of deflecting beam in a full three-dimensional range of paths.

Additionally, it would be highly beneficial to provide for an elevating structure that allows for multiple MEMS devices to be attached to any one elevating structure. This arrangement would allow for a higher area concentration of MEMS devices on a substrate, thus, imparting greater force and movement. In application, an increased device concentration would benefit MEMS pumps where improved flow rates could be realized. Device concentration could also be realized by fabricating systems having both elevating structures with attached MEMS devices and underlying MEMS devices attached directly to the substrate.

Further benefit can be gained by developing an elevating structure that not only raises MEMS device lines of attachment above the substrate but also provides for motion capabilities in and of itself. In this instance the elevating structure serves to impart dual actuation and/or force. The MEMS device can impart force or movement in one direction and the elevating structure can impart force or movement in another direction. This allows for the MEMS device to operate in variable planes depending on the orientation of the elevating structure.

As such, a need exists to provide for a MEMS elevating structure having corresponding attached MEMS devices spatially oriented in diverse planes above the underlying microelectronic substrate. This benefit can be realized in providing for MEMS forces and displacements in innumerable orientations and increasing MEMS device concentration on a given substrate. These benefits are particularly attractive to current MEMS devices that impart greater force, movement and overall precision. Many MEMS devices, such as attenuators, switches and pumps will benefit from having the diverse orientations, higher device concentration and variable planes of operation.

SUMMARY OF THE INVENTION

Microelectromechanical system (MEMS) apparatus are therefore provided that are capable of elevating the attachment point of MEMS devices in a plane remote from the underlying microelectronic substrate. Additionally, the MEMS apparatus provide the capability to spatially position the attached MEMS devices in diverse planes of orientation and to concentrate MEMS devices across the underlying microelectronic substrate.

The MEMS apparatus includes a microelectronic substrate and an elevating structure having a fixed portion attached to the substrate and a distal portion raised from the surface of the substrate. The distal portion of the elevating structure defines at least one zone of attachment. Additionally, the MEMS apparatus comprises a MEMS device attached to the distal portion of the elevating structure at one of the zones of attachment.

In one embodiment of the invention the attached MEMS device comprises an electrostatic actuator having first and second electrode films that are attached to the elevating structure at one of the zones of attachment. The MEMS electrostatic actuator may comprise one generally rigid film and one generally flexible film or the actuator may comprise two generally flexible films. In the embodiment in which the actuator comprises one generally rigid film and one generally flexible film, the flexible film can be biased to curl away from or towards the generally rigid film absent electrostatic forces. In the embodiment in which the actuator comprises two generally flexible films, the films can be biased to curl in the same or opposite direction. In other embodiments of the invention other MEMS devices, such as MEMS thermal bimorphs, may be attached to the elevating structure at one of the zones of attachment.

In those embodiments in which the MEMS devices comprise an electrostatic actuator the force and movement provided by the actuator may be used to incorporate switches, pumps, valves or other similar MEMS devices. In one embodiment the electrostatic actuator may comprise an optical attenuator. In such an embodiment, the flexible film(s) may include reflective surfaces that are capable of deflecting optical beams. In this fashion, the underlying substrate can serve as an optical table capable of directing the path of various optical beams that lie in planes proximate to the substrate.

The geometric configuration of the elevating structure will dictate the number of zones of attachment, as well as, the orientation of the planes that the attached MEMS devices will occupy. In a simplified embodiment the elevating structure defines one zone of attachment that is generally parallel to the underlying microelectronic substrate. In another embodiment of the invention, the distal portion of the elevating structure extends upward so that a generally flat segment lies perpendicular to the surface of the substrate. In one embodiment, the generally flat portion defines three zones of attachment that allow for MEMS devices to be attached to the elevating structure at planes of orientation generally perpendicular to the substrate. In another embodiment, the generally flat portion defines two zones of attachment that allow MEMS devices to be attached to the elevating structure at planes of orientation generally perpendicular to the substrate. In embodiments having more than one zone of attachment, MEMS devices can be attached to one or more of the zones.

In one embodiment of the invention the elevating structure is a passive device that remains relatively stationary upon release from the substrate. In another embodiment, the elevating structure is an active structure that can be electrostatically actuated via an electrode disposed in the elevating structure and an electrode deposited on the microelectronic substrate.

The invention is further embodied in an array of MEMS apparatus disposed on the surface of a microelectronic substrate. The array comprising more than one elevating structure disposed on the surface of the substrate in a predetermined pattern. Each elevating structure has a fixed portion attached to the substrate and a distal portion raised from the substrate that defines at least one zone of attachment. Additionally, each elevating structure has at least one MEMS device attached to the distal portion of each of the elevating structures at one of the predetermined zones of attachment. The MEMS devices attached to the elevating structures may comprise electrostatic actuators or other compatible MEMS devices.

The MEMS apparatus of the present invention allow for MEMS devices to be spatially oriented in diverse planes above the underlying microelectronic substrate. The benefit of this alignment can be realized in providing for MEMS forces and displacements in innumerable orientations. Additionally, by providing for placement of MEMS structures above the underlying substrate a higher concentration of MEMS devices can exist on a given substrate. Many MEMS devices, such as attenuators, switches and pumps will benefit from having diverse orientations, higher device concentration and variable planes of operation.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
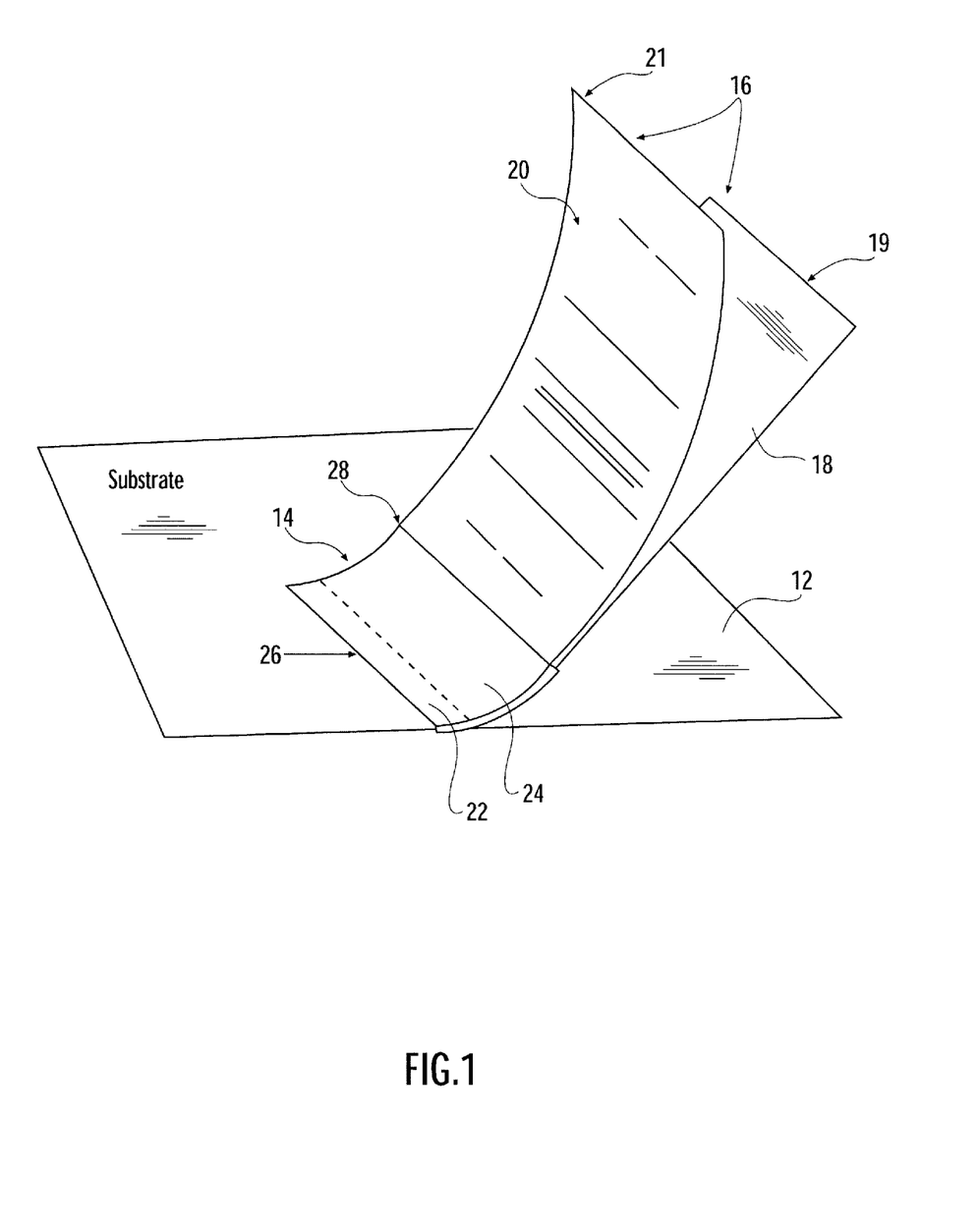
FIG. 1 is a perspective view of a MEMS apparatus having an elevating structure and an attached MEMS device in which the zone of attachment lies in a plane generally parallel to the underlying surface of the microelectronic substrate, in accordance with an embodiment of the present invention.

FIG. 1 is a perspective view illustration of a MEMS apparatus that embodies an elevating structure and an attached MEMS device in accordance with an embodiment of the present invention. The elevating structure allows for the attached MEMS device to be spatially positioned above the microelectronic substrate in order to facilitate different orientations. The MEMS apparatus 10 is formed on the surface of a microelectronic substrate 12 and comprises an elevating structure 14 and a MEMS device attached to the elevating structure. In the embodiment shown in FIG. 1 the MEMS device comprises an electrostatic actuator 16 that includes a first electrode film 18 and a second electrode film 20. The use of the electrostatic actuator in this embodiment and subsequent illustrated embodiments is shown by way of example only. For a more detailed discussion of MEMS electrostatic actuators see U.S. Pat. No. 6,236,491, entitled "Micromachined Electrostatic Actuator With Air Gap", issued on May 22, 2001, in the name of inventor Goodwin-Johansson and assigned to MCNC, the assignee of the present invention. That application is herein incorporated by reference as if set forth fully herein. The elevating structures of the current invention allow for any chosen MEMS device to be independently positioned spatially with respect to the microelectronic substrate. Therefore, it is also possible and within the inventive concepts herein disclosed to attach other MEMS devices, such as thermal bimorph acuators or magnetic field actuators, to the elevating structures of the current invention.

The elevating structure 14 is attached to the microelectronic substrate 12 at a fixed portion 22. As discussed in more detail subsequently, during formation of the MEMS apparatus a release process will result in the fixed portion of the elevating structure remaining attached to the microelectronic substrate while the residual distal portion 24 of the elevating structure is released from the microelectronic substrate. In the illustrated embodiment, in which the elevating structure is generally rectangular in plan view shape, the fixed portion 22 is correspondingly rectangular in plan view shape. It is also possible and within the inventive concepts herein disclosed to form the fixed portion so that it underlies less than the entire lengthwise side 26 of the elevating structure. The chosen area that will comprise the fixed portion will be dictated by many factors including, but not limited to, the plan view shape of the elevating structure, the degree of rigidity or flexibility required of the elevating structure and/or the configuration of the zones of attachment on the elevating structure.

The area of the elevating structure 14 that has been released from the microelectronic substrate 12 defines the distal portion 24. The distal portion will comprise at least one zone of attachment 28 at which the MEMS device is attached. In the embodiment shown in FIG. 1 the zone of attachment begins at the line corresponding with the released, lengthwise side of the elevating structure. It is possible and within the inventive concepts herein disclosed to have more than one zone of attachment associated with the distal portion of an elevating device. It is also possible and within the inventive concepts herein disclosed for the zone of attachment to be nonlinear in configuration. Various examples of embodiments of the invention having elevating structures with multiple zones of attachments are shown and discussed below in detail.

The elevating structure can comprise any suitable material used in microelectronic device fabrication. These materials may include, but are not limited to, metals, such as nickel or gold and insulating materials, such as polyimide, silicon nitride or silicon oxide. The elevating structure may be formed as a generally rigid, passive structure or as a flexible, dynamic structure capable of being actuated by electrostatic, thermal or other actuation means. In the dynamic embodiments the elevating structure is capable of being activated to impart movement relative to the microelectronic substrate. Thus, in the dynamic embodiment it is possible for the elevating structure to remain in a non-elevated state (i.e. relatively parallel to the substrate) in the absence of electrostatic forces and for the elevating structure to ascend from the substrate upon the application of electrostatic force. It is also possible to form a dynamic elevating structure, typically formed of polysilicon, that is elevated in the absence of electrostatic force and descends towards the substrate upon the application of electrostatic force. The rigidity or flexibility of the elevating structure will be dictated by such factors as the choice of materials, the thickness of layers and the layering configuration used to form the elevating structure.

Figure 2:
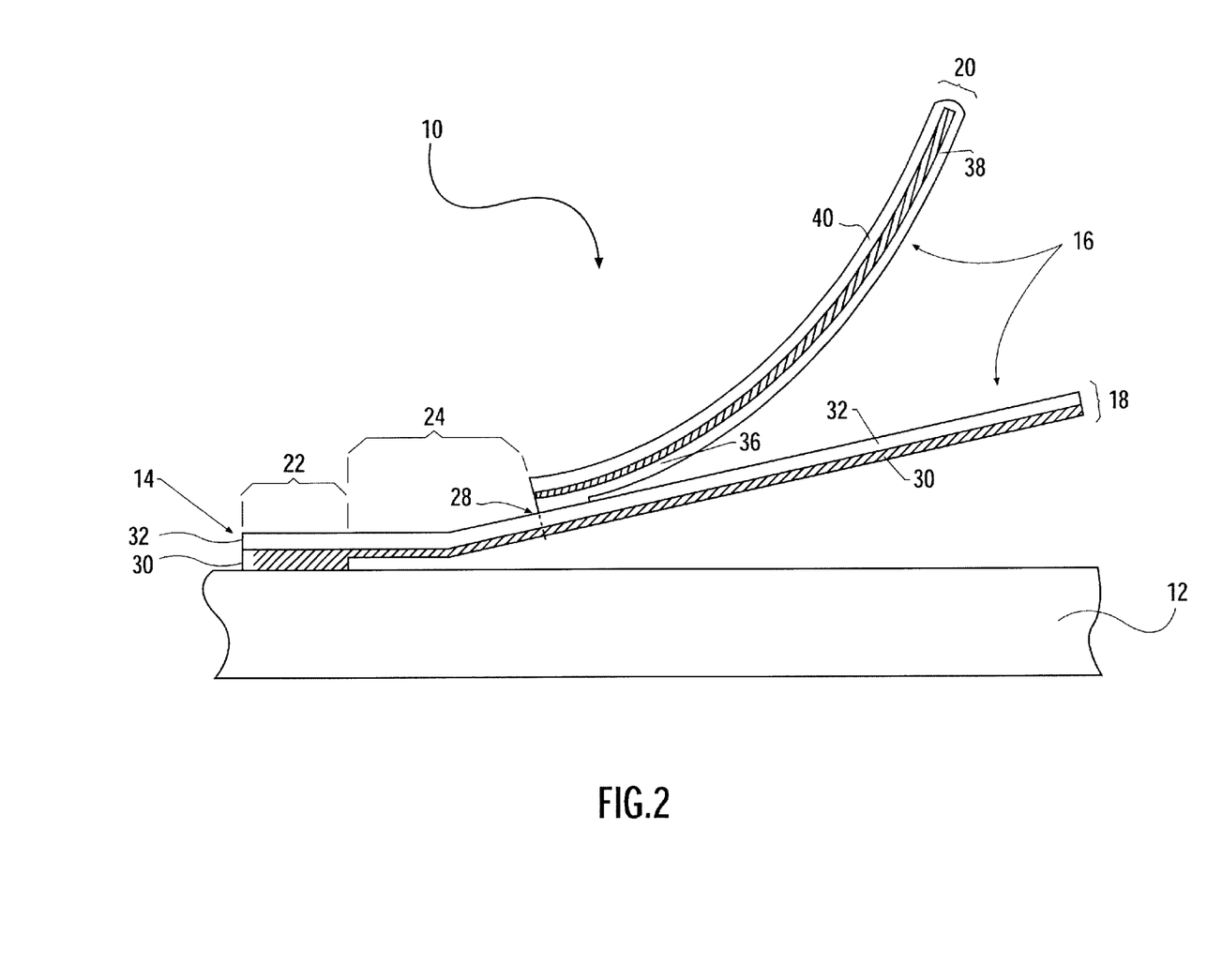
FIG. 2 is a cross-sectional diagram of a MEMS apparatus having a passive elevating structure and an attached MEMS device, in accordance with an embodiment of the present invention.

FIG. 2 is a cross-sectional diagram of a MEMS apparatus 10 having a generally passive elevating structure 14 and an attached MEMS electrostatic actuator 16 in accordance with an embodiment of the present invention. By way of example, in this embodiment the elevating structure and the first electrode film 18 are formed of the same materials during the same processing stages and thus they comprise identical layering structure. In accordance with the perspective view of FIG. 1, it also possible and in many applications, preferred, to form the elevating structure 14 and the second electrode film 20 from the same materials during the same processing stages. Additionally, the elevating structure may be formed irrespective of the materials and layering used to form any portion of the attached MEMS device. It will be understood by those having ordinary skill in the art that when a layer is described herein as being "on" another layer/element, it may be formed directly above or below the layer/element or one or more intervening layers may be provided between the layers.

The elevating structure 14 comprises a fixed portion 22 that is attached to the microelectronic substrate 12 and a distal portion 24 that is released and, typically, elevated from the microelectronic substrate. As shown in FIG. 2, the elevating structure is formed of a first electrode layer 30 and a first insulating layer 32. In this embodiment the elevating structure is generally rigid and remains in a relatively fixed position upon release from the substrate. The microelectronic substrate is preferably formed of silicon, although any suitable microelectronic substrate material, such as glass, quartz or polymeric material can be used. The first electrode layer is typically formed of a conductive metal material, such as gold, nickel or copper. If the first electrode layer is formed from a layer of gold, optionally a thin layer of chromium (not shown in FIG. 2) may be deposited prior to depositing the first electrode layer to allow better adhesion to the microelectronic substrate and/or after the first electrode layer has been deposited to allow better adhesion to the subsequent first insulating layer. Alternatively, other suitable metallic or conductive materials may be used to form the first electrode layer so long as release layer processing operations do not erode the first electrode layer. Standard photolithography and etching techniques are typically used to deposit the first electrode layer on the surface of the substrate.

The first insulating layer 32 of the elevating structure 14 preferably comprises a non-oxidation-based insulator or polymer, such as polyimide or silicon nitride. In this application, oxide based insulators are avoided if certain acids (such as hydrofluoric acid) are used in processing to remove underlying or overlying release layers. The first insulating layer is preferably formed by using a standard deposition technique, such as low-pressure chemical vapor deposition (LPCVD) or spin-on methods, to deposit the insulating layer on the first electrode layer. Other insulators, even oxide-based insulators, may be used if compatible acids or etchants are used for removing the release layer. For instance, silicon dioxide could be used for the insulating layer if etchants not containing hydrofluoric acid are used. To insure proper rigidity and relative flatness in the elevating structure 14 and the extending first electrode film 18 the materials chosen for the first insulating layer 32 and first electrode layer 30 should be thermally compatible so as to minimize the stress built into the overall structure during fabrication.

Release layers (not shown in FIG. 2) will be used to provide for the release of the elevating structure 14 from the substrate 12 and the release of the first electrode film 18 from the second electrode film 20. Accordingly, during fabrication a first release layer, typically an oxide material, is deposited on the substrate by a conventional deposition technique, such as PVD prior to the formation of the elevating structure. A second release layer, typically an oxide material, is deposited on the first electrode film prior to forming the second electrode film. Typically, after the overall layering of the composite device has been completed, the release layers are removed by subjecting the device to release operation, such as an acidic bath.

Figure 4:
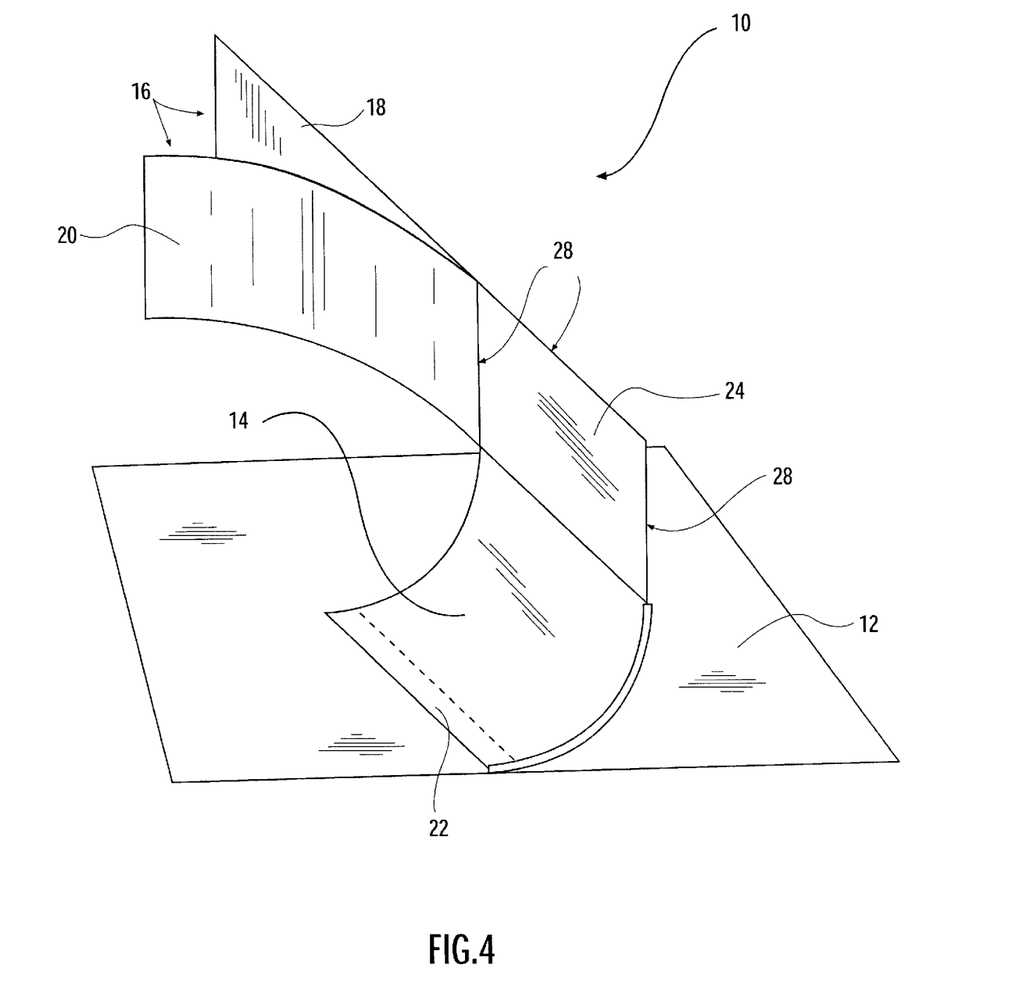
FIG. 4 is a perspective view of a MEMS apparatus having an elevating structure with a generally flat distal portion defining three zones of attachment, in accordance with an embodiment of the present invention.
Figure 5:
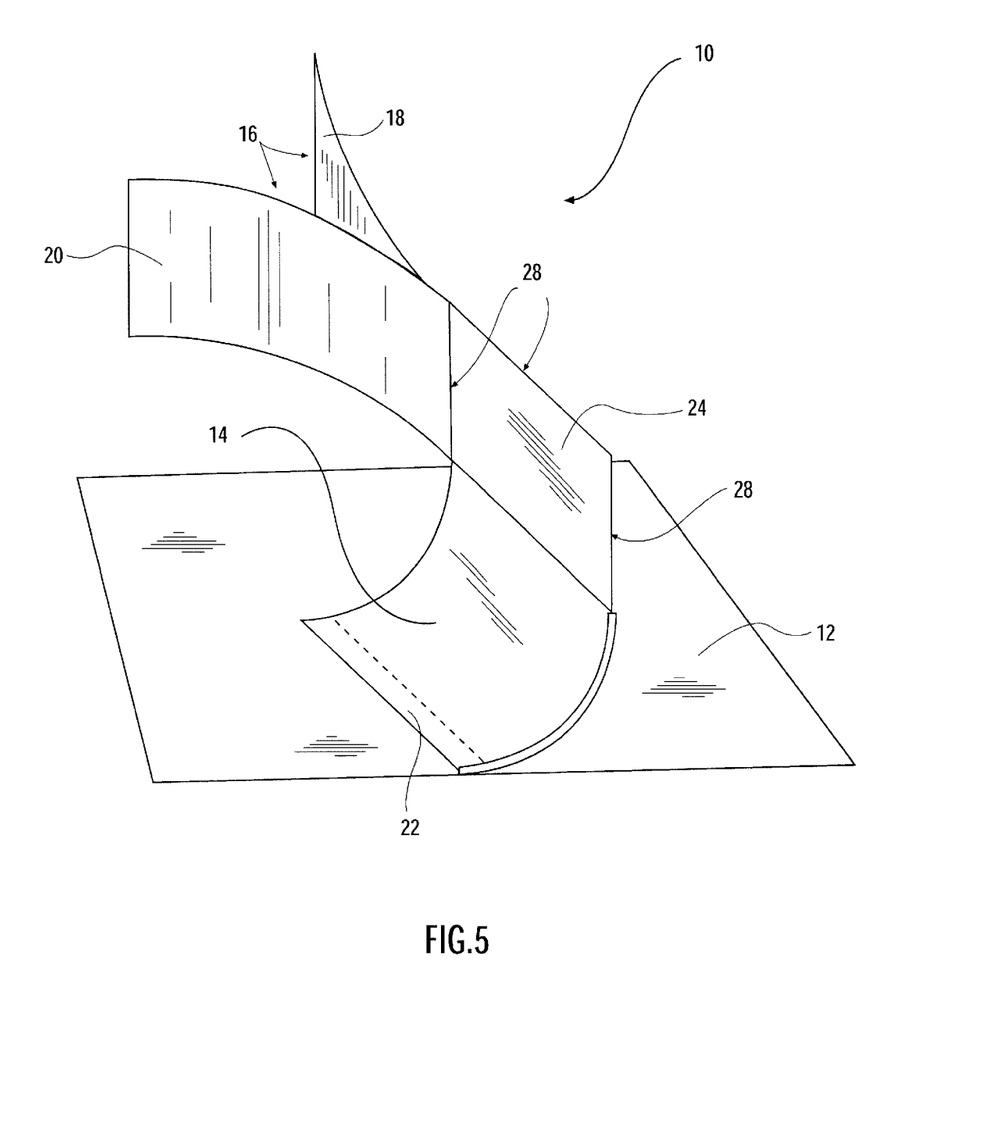
FIG. 5 is a perspective view of a MEMS apparatus having an elevating structure with a generally flat distal portion defining three zones of attachment and an attached dual flexible film electrostatic actuator, in accordance with an embodiment of the present invention.

In alternate embodiments of the invention, it may be desirable to form the elevating structure 14 with a high degree of curvature, such as the elevating structure depicted in FIGS. 4 and 5. The high degree of curvature can be accomplished by building intrinsic stress into the elevating structure during fabrication. Many factors can influence built-in stress, including, but not limited to, the thickness of the layers in the elevating structure, the variance in the thermal coefficients of expansion of the materials used to form the elevating structure and the deposition temperatures used to form the layers. Thus, by altering the materials used to form the elevating structure, the thickness of the layers and/or the processing characteristics, it is possible to fabricate elevating structures that have the necessary degree of curvature desired. In many embodiments in which the elevating structure has a high degree of curvature the elevating structure will be formed in unison with the more flexible electrode film and mirror the construct of the more flexible electrode film (i.e. second electrode film 20 in FIGS. 1 and 2).

The distal portion 24 of the elevating structures defines a zone of attachment 28 at which a MEMS device is attached to the elevating structure. In many embodiments the second electrode film is an extension of the elevating structure and, therefore, the elevating structure will comprise layering similar to the second electrode film. This is in contrast to the FIG. 2 embodiment MEMS device in which the first electrode film 18 is an extension of the elevating structure 14 and, therefore, the elevating structure comprises the first electrode layer 30 and the first insulating layer 32. The first electrode film is released and elevated from the microelectronic substrate during the same release process that releases the distal portion of the elevating structure. The first electrode film in this embodiment is a generally rigid structure that remains relatively stationary in relationship to the second electrode film after application of electrostatic forces.

In other embodiments of the invention, the first electrode film may be formed independent of the elevating structure and, thus, the first electrode film may have dissimilar layering and/or materials in comparison to the elevating structure. It is also possible to form both the first and second electrode films independent of the elevating structure, thereby, allowing for variance in the materials and/or layering between the elevating structure and all components of the attached MEMS device.

The second electrode film 20 in FIG. 2 comprises a generally flexible composite structure that overlies the first electrode film 18. As shown in FIG. 2, the second electrode film may comprise a first biasing layer 36, a second electrode layer 38 and a second biasing layer 40. This sandwich-type construction is shown by way of example and other layering configurations of the second electrode film are also possible and within the inventive concepts herein disclosed. Alternatively, the second electrode layer may comprise a single biasing layer disposed on either side of the second electrode layer or the second electrode layer may comprise additional biasing layers. The number of biasing layers, the thickness of biasing layers and the materials used to form the biasing layers will be selected based upon the desired biasing of the second electrode film and the degree of actuation required during operation. Preferably, all the layers comprising the second electrode film are formed from a flexible material, for instance the biasing layers may be formed of flexible polymers and the second electrode layer may be formed of flexible conductors. In one embodiment the first and second biasing layers will comprise a flexible polymer film used to hold the second electrode film in a stationary position absent electrostatic forces. The flexible polymer film may also serve as an insulator that allows for the complete electrical isolation between the first electrode layer and the second electrode layer. The first and second biasing layers may, preferably, comprise a polyimide material, however, other suitable flexible polymers capable of withstanding the release layer etch process can also be employed.

As shown in FIG. 2, beginning at the zone of attachment 28 the first biasing layer 36 is attached to the underlying first electrode film 18. Subsequent to depositing the first biasing layer, the second electrode layer 38 and the second biasing layer 40 are deposited thereon. After the overall second electrode film has been constructed the release layer that is formed between the first and second electrode films (not shown in FIG. 2) is removed and results in the second electrode film being positionally biased relative to the underlying first electrode film. In operation, when electrostatic forces are applied between the first and second electrode layers the flexible second electrode film 20 will be actuated relative to the fixed first electrode film 18.

The second electrode layer 38 will preferably comprise a layer of flexible conductor material. In the embodiment shown in FIG. 2 the second electrode layer is deposited on the first biasing layer 36. In an alternate embodiment, in which the first biasing layer is optionally omitted, the second electrode layer will form the point of attachment to the underlying first electrode film 18. The second electrode layer preferably will comprise gold, although other conductors tolerant of release layer processing and possessing adequate flexibility, such as conductive polymer materials, may also be used. If gold is used to form the second electrode layer, a thin layer of chromium (not shown in FIG. 2) may be deposited on the second electrode layer to allow better adhesion of the gold layer to the adjacent materials.

Additionally, the elevating structure of the present invention will comprise electrical traces (not shown in FIGS. 1 and 2) that serve to electrically connect the first and second electrode layers 30 and 38 to an external source for electrostatic voltage. The external source for electrostatic voltage is typically in communication with the MEMS apparatus 10 via the underlying microelectronic substrate 12.

Figure 3:
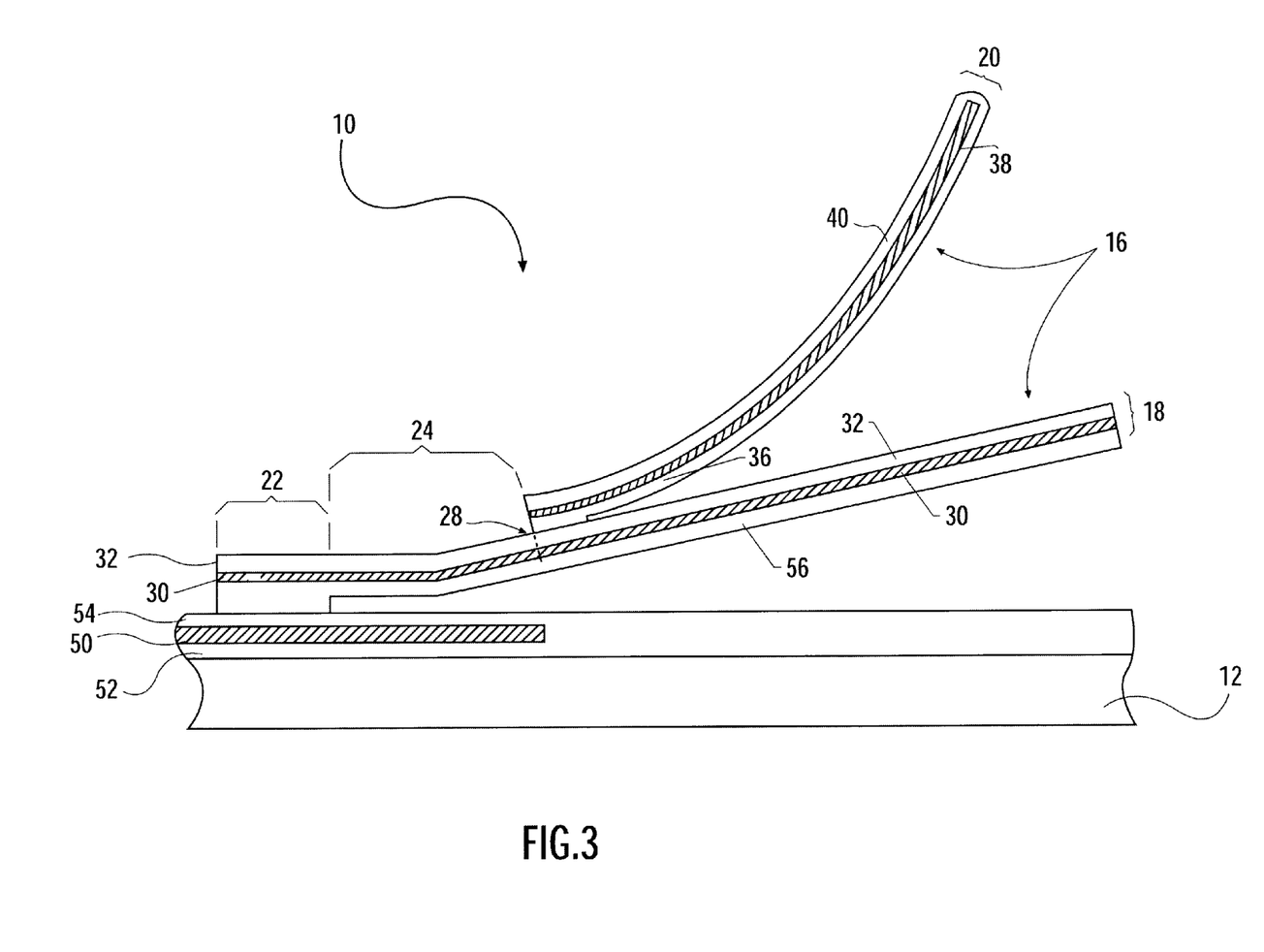
FIG. 3 is a cross-sectional diagram of a MEMS apparatus having an active elevating structure and an attached MEMS device, in accordance with an embodiment of the present invention.

FIG. 3 is a cross-sectional diagram of a MEMS apparatus 10 having a dynamic, active elevating structure 14 and an attached MEMS electrostatic actuator 16 in accordance with an embodiment of the present invention. In this embodiment, a substrate electrode 50 is positioned on the microelectronic substrate 12 to provide the means for electrostatic actuation between substrate and the elevating structure. In this regard voltage can be supplied to the substrate electrode and first electrode layer in the elevating structure to alter the spacing between the distal portion 24 of the elevating structure and the substrate. In this embodiment, typically the substrate electrode will be sandwiched between a first substrate insulating layer 52 and a second substrate insulating layer 54. The substrate insulating layers provide electrical isolation between the substrate electrode, the substrate and the first and second electrode layers 30 and 38 of the MEMS apparatus.

The first and second substrate insulating layers 52 and 54 preferably comprise a non-oxidation-based insulator or polymer, such as polyimide or nitride. In certain embodiments that implement microelectronic substrate materials having strong insulation characteristics it may be possible to deposit the substrate electrode without the need for a first substrate insulating layer. In various applications, oxide based insulators are avoided if certain acids (such as hydrofluoric acid) are used in processing to remove subsequent release layers. The first and second substrate insulating layers are preferably formed by using a standard deposition technique, such as low-pressure chemical vapor deposition (LPCVD) or other suitable spin-on processes.

The substrate electrode 50 is deposited as a generally planar layer affixed to at least a portion of the surface of the underlying first substrate insulating layer 52 or microelectronic substrate 12. The substrate electrode preferably comprises gold. If the substrate electrode is formed from gold, optionally a thin layer of chromium (not shown in FIG. 3) may be deposited prior to depositing the substrate electrode to allow better adhesion to the first substrate insulating layer and/or after the substrate electrode has been deposited to allow better adhesion to any subsequent adjacent materials. Alternatively, other suitable metallic or conductive materials may be used for the substrate electrode so long as release layer processing operations do not result in electrode erosion. Standard photolithography and etching techniques are typically used to deposit the electrode on the surface of the substrate and to limit the substrate electrode to the area underlying the elevating structure.

In the FIG. 3 embodiment the elevating structure 14 and the first electrode film 18 that extends from the elevating structure have an additional second insulating layer 56 disposed between the substrate and the first electrode layer 30. The second electrode layer is typically required to provide electrical isolation between the substrate electrode 50 and the first electrode layer 30. It should be noted that in those embodiments that require a second insulating layer in the elevating structure, the second insulating layer serves as the attachment point to the underlying microelectronic substrate 12. It may also be possible to construct the dynamic elevating structure MEMS apparatus without the second insulating layer in embodiments in which the second substrate insulating layer 54 provides sufficient electrical isolation.

Figure 6:
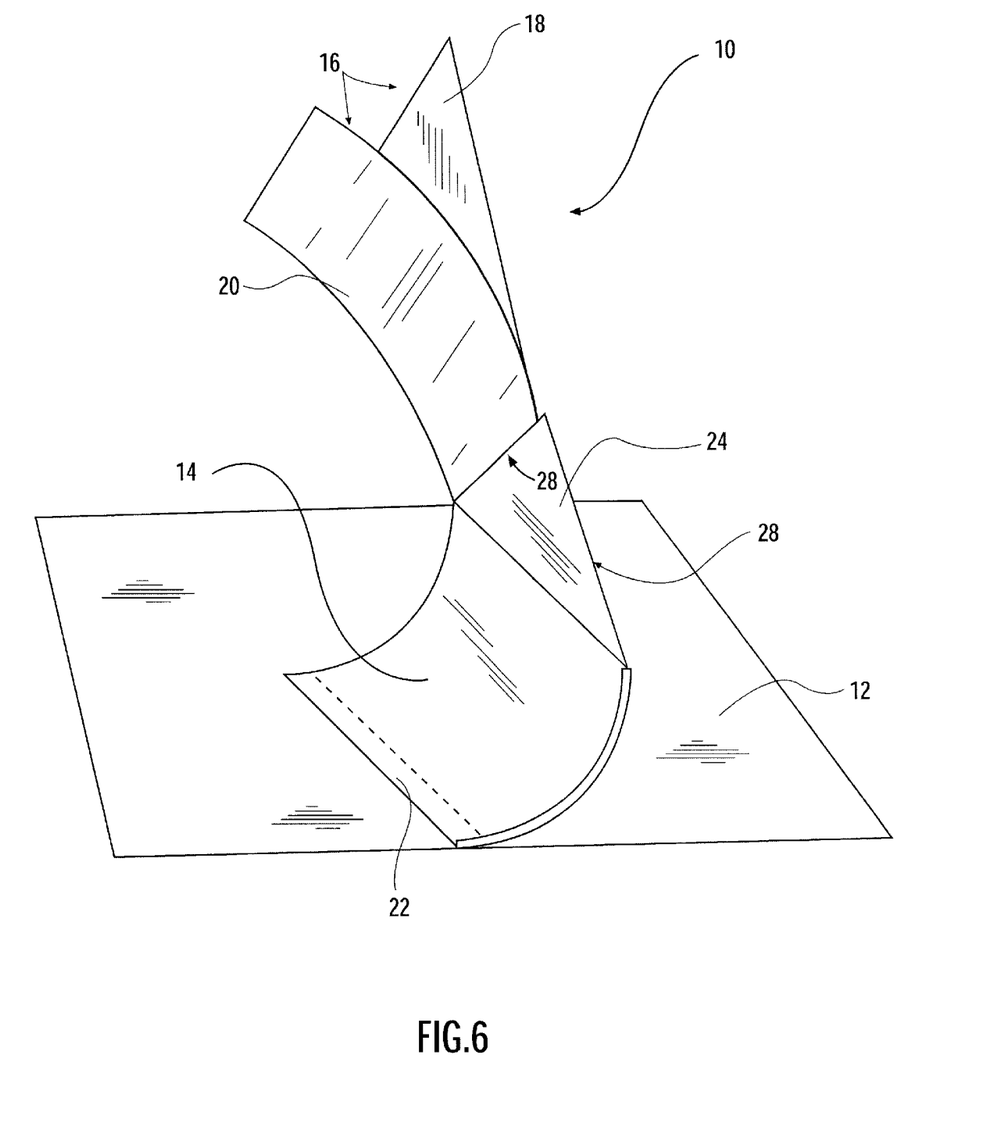
FIG. 6 is a perspective view of a MEMS apparatus having an elevating structure with a generally flat distal portion defining two zones of attachment, in accordance with an embodiment of the present invention.

FIGS. 4, 5 and 6 are perspective view illustrations of three alternative embodiments of the MEMS elevating structure in accordance with further embodiments of the present invention. FIG. 4 depicts a MEMS apparatus 10 having an elevating structure 14 that has an elongated distal portion 24 which allows the elevating structure to be spatially positioned in a plane that is generally perpendicular to the plane in which the substrate lies in. This configuration of the elevating structure allows for three distinct zones of attachment 28 along the three edges of the distal portion of the elevating structure. While this illustration shows only one zone of attachment having a corresponding MEMS device attached, it is possible and within the inventive concepts herein disclosed to use all three zones of attachment or any combination thereof when fabricating the MEMS apparatus. In this embodiment the distal portion of the elevating structure that encompasses the zones of attachment will be characteristically rigid to allow for this segment of the distal portion to extend and remain relatively stationary in the plane perpendicular to the substrate. Additionally, the biasing of the elevating structure will typically allow for the curl in the released portion of the elevating structure to achieve an approximately 90-degree bend. The rigidity and the biasing of the elevating structure can be controlled by various factors including, but not limited to, the choice of materials used, the expansion coefficients of the materials used and the thickness of the various layers in the elevating structure. The elevating structure of this embodiment can be a relatively passive structure or it can be an active structure capable of electrostatic actuation in relation to the underlying substrate. The elevating structure shown in FIGS. 4–6 having a highly curled portion and a generally flat distal portion 24 is formed by controlling the thickness of the insulating (i.e. biasing) layers or by adding more insulating/biasing layers to the elevating structure. By controlling the thickness of the insulating layers, the internal stress within the elevating structure is controlled and, hence the degree of curl in the elevating structure is controlled.

FIG. 5 illustrates a perspective view of a MEMS apparatus 10 having an elevating structure 14 that is similar to the elongated distal portion 24 shown in FIG. 4. The FIG. 5 embodiment differs from the FIG. 4 embodiment in that the attached MEMS device in the FIG. 5 embodiment is a MEMS electrostatic actuator having both the first electrode film 18 and the second electrode film 20 as flexible films capable of being actuated upon the application of an electrostatic force. In this embodiment the layering of the first electrode film may be similar to the layering of the second electrode film. In that regard, the electrode layers and/or biasing layers in the first and second electrode films may comprise flexible materials capable of sustaining the actuation of the films. As shown in FIG. 5, the flexible films are positionally biased to curl away from one another. Depending on the required application, it would also be possible to construct the flexible films so that they curl in the same direction as one another or that they curl in the same or opposite direction with varying radii.

FIG. 6 illustrates a perspective view of a MEMS apparatus 10 having an elevating structure 14 that has an elongated distal portion 24 which allows the elevating structure to be spatially positioned in a plane that is generally perpendicular to the plane in which the substrate lies in and defines zones of attachment 28 that are non-orthogonal to the plane of the substrate. This configuration of the elevating structure allows for two distinct zones of attachment 28 along the two edges of the distal portion of the elevating structure. While this illustration shows only one zone of attachment having a corresponding MEMS device attached, it is possible and within the inventive concepts herein disclosed to attach MEMS device to either or both zones of attachment. In this embodiment the distal portion of the elevating structure that encompasses the zones of attachment will be characteristically rigid to allow for this flat segment of the distal portion to extend and remain relatively stationary in the plane perpendicular to the substrate. Additionally, the biasing of the elevating structure will typically allow for the curl in the released portion of the elevating structure to achieve an approximately 90-degree bend. The rigidity and the biasing of the elevating structure can be controlled by various factors including, but not limited to, the choice of materials used, the expansion coefficients of the materials used and the thickness of the various layers in the elevating structure. The elevating structure of this embodiment can be a relatively passive structure or it can be an active structure capable of electrostatic actuation in relation to the underlying substrate. It is possible to configure the flat segment of the distal portion of the elevating structure in other shapes to allow for variations in the zones of attachment.

The number of zones of attachment associated with any one elevating structure is not limited to the embodiments depicted. It also possible and within the inventive concepts herein disclosed to fabricate elevating structures having more than three zones of attachment. For instance, the flat segment of the distal portion of the elevating structure may have a generally semi-circular shape that would allow for zones of attachment to exist across any arc in the semi-circle.

It is also possible and within the inventive concepts herein disclosed to provide for MEMS electrostatic actuators having more than two electrode films extending from any one zone of attachment. The multiple film actuators may comprise any combination of rigid or flexible films. Additionally, it is also possible for any one electrode film to have both curved, flexible regions and flat, rigid regions depending on the desired application for the electrostatic actuator. For instance, it is possible to design an electrode film having an initial curved, flexible region nearest the zone of attachment and a generally flat, rigid region furthest from the zone of attachment. If the generally flat, rigid region comprised a reflective surface, such an actuator would be instrumental as an optical attenuator capable of deflecting optical beams across the surface of the substrate while maintaining adequate spacing between the optical beam and the substrate.

The elevating structures of the present invention also provide for embodiments of the invention in which multiple MEMS devices are combined in a hierarchical manner from a single elevating structure to create complex apparatus. In this fashion, one or more additional secondary MEMS devices can be attached and extended from the distal end of the MEMS device that is attached to the elevating structure. For instance, in the FIG. 1 embodiment one or more additional secondary MEMS devices can be attached to either the generally stationary first electrode film 18 at the distal end 19 or the generally flexible second electrode film 20 at the distal end 21. Preferably, one or more additional secondary MEMS devices would be attached to the distal end of the second electrode film and comprise a generally flexible film and a stationary film. The additional MEMS devices can be activated individually or in unison with the MEMS device attached directly to the elevating structure. In hierarchical manner, it is possible to attach and extend additional tertiary MEMS devices (and so forth) to the distal portion of the secondary MEMS device to create the desired configuration as the application dictates. A single elevating structure allows for numerous MEMS devices to be concentrated in a variety of orientations in relation to the underlying substrate. In addition, an array of such MEMS apparatus disposed on a substrate provides for multifaceted tasking of the devices. The use of such highly concentrated and intricate MEMS device schemes can be realized in MEMS displays, switches, pumps, valves and the like.

Figure 7A:
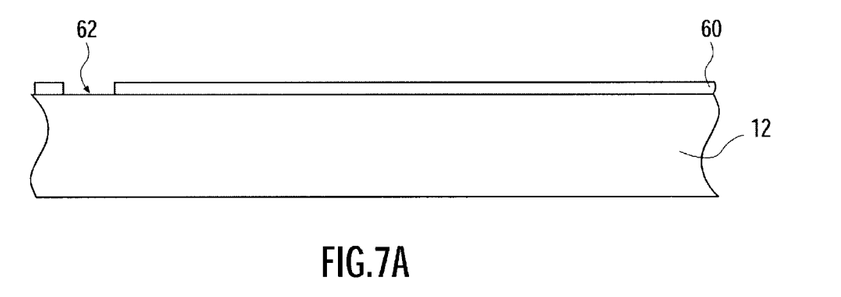
FIGS. 7A–7E are cross-sectional views of various stages in the fabrication process of a MEMS apparatus having an elevating structure and an attached MEMS flexible film actuator, in accordance with an embodiment of the present invention.
Figure 7B:
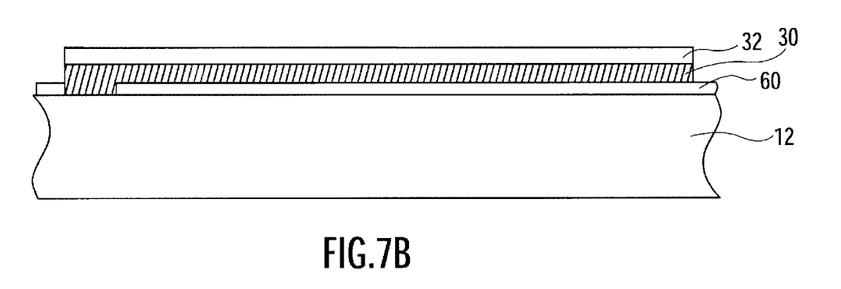

Additionally, the present invention provides for a method of making a MEMS apparatus having an elevated structure and an attached MEMS device. FIGS. 7A–7E illustrate various stages in the fabrication of the MEMS apparatus, in accordance with a method of making an embodiment of the present invention. FIG. 7A is a cross-sectional view of a microelectronic substrate 12 after the first release layer 60 has been patterned and deposited on the substrate. The first release layer, typically an oxide, will subsequently be removed to facilitate release of the elevating structure and the first electrode film. A trench 62 has been patterned into the release layer to allow for an attachment point for the elevating structure. A conventional deposition technique, such as PVD or CVD, is typically used to deposit the first release layer. FIG. 7B depicts the MEMS apparatus construct after the elevating structure and first electrode film have been formed thereon. The first electrode layer 30 will typically comprise gold or another suitable conductive material. The first electrode layer is deposited on the surface of the release layer and on the surface of the substrate exposed by the trench typically using conventional photolithography and etching techniques. The first insulating layer 32 will typically comprise a non-oxidation-based insulator or polymer, such as polyimide or silicon nitride. The first insulating layer is deposited on the first electrode layer typically using a standard deposition technique, such as low-pressure chemical vapor deposition (LPCVD).

Figure 7C:
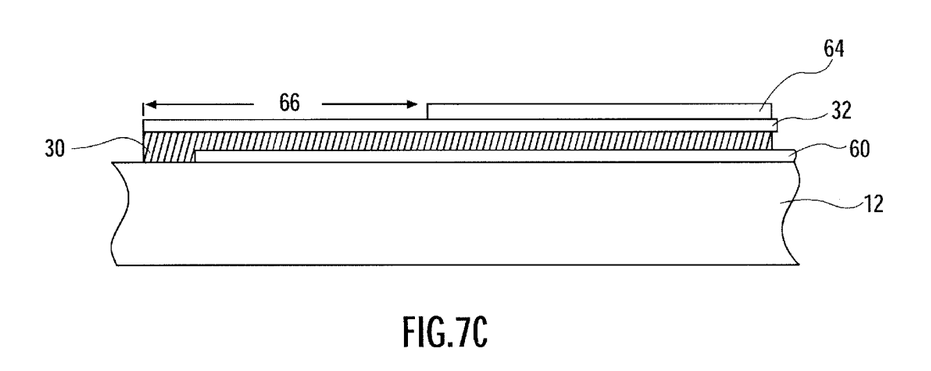
Figure 7D:
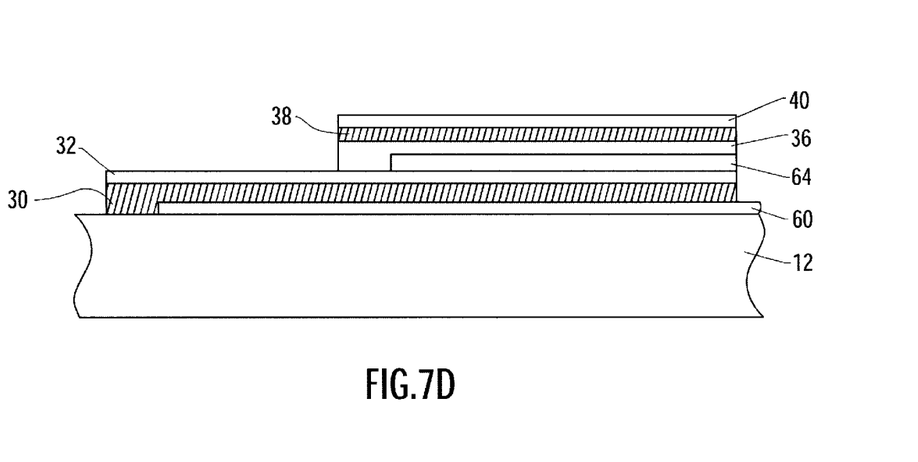

FIG. 7C illustrates the MEMS apparatus after the second release layer 64 has been patterned and deposited on the first insulating layer 32. The second release layer, typically an oxide, will subsequently be removed to facilitate release of the second electrode film. A patterned region 66 has been patterned into the release layer to allow for an attachment point for the elevating structure. A conventional deposition technique, such as PVD or CVD, is typically used to deposit the second release layer. FIG. 7D depicts the MEMS apparatus construct after the second electrode film has been formed thereon. The second electrode film comprises first biasing layer 36, second electrode layer 38, and second biasing layer 40. The first and second biasing layers will typically comprise a flexible polymeric material, such as polyimide, however, other suitable flexible polymers capable of withstanding the release layer etch process can also be employed. The first and second insulating layers are typically deposited using a standard deposition technique, such as low-pressure chemical vapor deposition (LPCVD) or suitable spin-on processes. The second electrode layer 38 is typically formed from gold or another suitable conductive material. The second electrode layer is deposited on the surface of the first biasing layer typically using conventional photolithography and etching techniques.

Figure 7E:
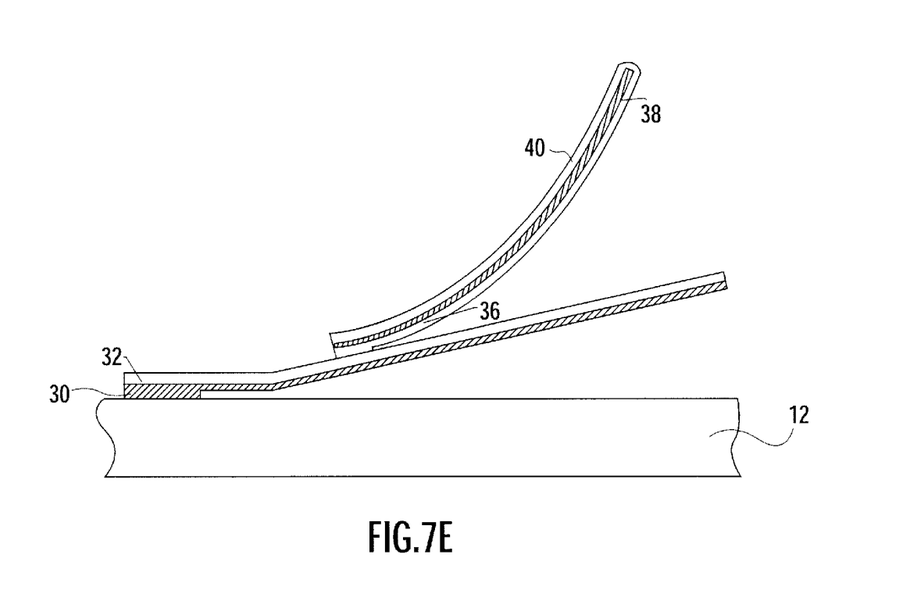

In FIG. 7E, the MEMS apparatus is shown as a completed structure having undergone release layer removal. The first and second release layers 60 and 64 are removed by exposing the apparatus to a suitable etchant/acid. The etchant/acid should be suitable to remove the chosen release layer material while not adversely effecting the surrounding electrode, biasing and/or insulating layer. Upon removal of the release layers the elevating structure and the first and second electrode films will separate from their respective underlying surfaces. The elevating structure and the electrode films will generally curl in accordance to the intrinsic stress that is built-up in these structures.

The embodiments of the present invention that have been detailed above provide for MEMS apparatus that are capable of spatially orienting MEMS device in diverse planes in relation to the underlying microelectronic substrate. Such devices provide for MEMS devices to be operated across a wide spectrum of spatial orientation; imparting MEMS forces and displacements in innumerable orientations. Additionally, by raising the MEMS devices attachment point beyond the substrate it is possible to increase the MEMS device concentration on a given substrate. These benefits are particularly attractive to current MEMS devices that impart greater force, movement and overall precision. Many MEMS devices, such as attenuators, switches and pumps will benefit from having diverse orientations, higher device concentration and variable planes of operation.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A microelectromechanical (MEMS) apparatus, comprising:
   a microelectronic substrate having a first surface;
   an elevating structure having a fixed portion attached to said first surface of said microelectronic substrate and a distal portion capable of being raised from said first surface of said microelectronic substrate, wherein the distal portion defines at least one zone of attachment; and
   a MEMS device attached to the distal portion of said elevating structure at the least one zone of attachment.

2. The MEMS apparatus of claim 1, wherein said MEMS device further comprises a MEMS electrostatic actuator having a first electrode film and a second electrode film, wherein said first and second electrode films are attached to said elevating structure at the at least one zone of attachment.

3. The MEMS apparatus of claim 2, wherein said first electrode film comprises a first electrode layer.

4. The MEMS apparatus of claim 3, wherein said first electrode film further comprises at least one insulating layer.

5. The MEMS apparatus of claim 3, wherein said first electrode film further comprises at least one biasing layer.

6. The MEMS apparatus of claim 2, wherein said second electrode film comprises a second electrode layer.

7. The MEMS apparatus of claim 6, wherein said second electrode film further comprises at least one insulating layer.

8. The MEMS apparatus of claim 6, wherein said second electrode film further comprises at least one biasing layer.

9. The MEMS apparatus of claim 2, wherein said second electrode film is more flexible than said first electrode film.

10. The MEMS apparatus of claim 9, wherein said second electrode film. is positionally biased to curl generally away from the first electrode film prior to applying voltage.

11. The MEMS apparatus of claim 9, wherein said second electrode film is positionally biased to curl generally towards the first electrode film prior to applying voltage.

12. The MEMS apparatus of claim 2, wherein said first electrode film and said second electrode film are generally flexible structures.

13. The MEMS apparatus of claim 12, wherein said first and second electrode films are positionally biased to curl in the same general direction.

14. The MEMS apparatus of claim 12, wherein said first and second electrode films are positionally biased to curl in generally opposite directions.

15. The MEMS apparatus of claim 2, wherein said first electrode film is an extension of said elevating structure.

16. The MEMS apparatus of claim 2, wherein said second electrode film is an extension of said elevating structure.

17. The MEMS apparatus of claim 2, wherein said first electrode film has a reflective surface capable of deflecting the path of a light beam.

18. The MEMS apparatus of claim 2, wherein said second electrode film has a reflective surface capable of deflecting the path of a light beam.

19. The MEMS apparatus of claim 2, wherein said first and second electrode films have reflective surfaces capable of deflecting the path of a light beam.

20. The MEMS apparatus of claim 1, wherein said MEMS device further comprises a MEMS thermal bimorph structure capable of being actuated by supplying heat to the structure.

21. The MEMS apparatus of claim 2, wherein said elevating structure further comprises means for electrical communication between a source of electrical energy and the first and second electrode films.

22. The MEMS apparatus of claim 1, wherein said elevating structure is positionally biased so that the distal portion curves away from the first surface of said microelectronic substrate.

23. The MEMS apparatus of claim 1, wherein said at least one zone of attachment is generally parallel to the plane of the first surface of said microelectronic substrate.

24. The MEMS apparatus of claim 1, wherein said at least one zone of attachment is generally perpendicular to the plane of the first surface of said microelectronic substrate.

25. The MEMS apparatus of claim 1, wherein said at least one zone of attachment generally lies in a plane that is non-orthogonal to the plane of the first surface of the microelectronic substrate.

26. The MEMS apparatus of claim 1, wherein said distal portion of said elevating structure comprises a biased curled segment and a generally flat segment that follows said biased curled segment.

27. The MEMS apparatus of claim 26, wherein the generally flat segment lies in a plane generally perpendicular to the plane of said first surface of said microelectronic substrate.

28. The MEMS apparatus of claim 26, wherein the generally flat segment lies in a plane that is non-orthogonal to the plane of said first surface of said microelectronic substrate.

29. The MEMS apparatus of claim 26, wherein said flat segment of said distal portion has a generally rectangular shape that defines three zones of attachment.

30. The MEMS apparatus of claim 26, wherein said flat segment of said distal portion has a generally triangular shape that defines two zones of attachment.

31. The MEMS apparatus of claim 26, wherein said flat segment of said distal portion has a predetermined shape that defines more than one zones of attachment.

32. The MEMS apparatus of claim 1, further comprising a substrate electrode disposed on said microelectronic substrate and an elevating structure electrode disposed on said elevating substrate, wherein applying voltage to the substrate electrode and the elevating structure electrode actuates the elevating structure to alter the position of the elevating structure relative to said microelectronic substrate.

33. The MEMS apparatus of claim 1, wherein the MEMS device attached to the distal portion of said elevating structure defines at least one zone of attachment for attaching additional MEMS devices to said MEMS device.

34. A microelectromechanical (MEMS) electrostatic actuator, comprising:
a microelectronic substrate having a first surface;
an elevating structure having a fixed portion attached to said first surface of said microelectronic substrate and a distal portion capable of being raised from said first surface of said microelectronic substrate, wherein the distal portion defines at least one zone of attachment;
a first electrode film extending from one of said at least one zone of attachment; and
a second electrode film attached to said elevating structure at the one of said at least one zone of attachment, wherein the first and second electrode films are adapted for electrostatic actuation to controllably move relative to one another.

35. An array of MEMS apparatus comprising:
a microelectronic substrate having a first surface;
a plurality of elevating structures arranged in a pattern, each elevating structure having a fixed portion attached to said first surface of said microelectronic substrate and a distal portion capable of being raised from said first surface of said microelectronic substrate, wherein the distal portion defines at least one zone of attachment; and
a plurality of MEMS devices attached to the distal portion of respective elevating structures at a predetermined zone of attachment.

36. An array of MEMS electrostatic actuators comprising:
a microelectronic substrate having a first surface;
a plurality of elevating structures arranged in a pattern, each elevating structure having a fixed portion attached to said first surface of said microelectronic substrate and a distal portion raised from said first surface of said microelectronic substrate, wherein the distal portion defines at least one zone of attachment;
a first electrode film extending from one of said at least one zone of attachment of each elevating structure; and
a second electrode film attached to each of said elevating structures at the one of said at least one zone of attachment, wherein the first and second electrode films are adapted for electrostatic actuation to controllably move relative to one another.

37. A MEMS electrostatic switch comprising:
a microelectronic substrate having a first surface;
an elevating structure having a fixed portion attached to said first surface of said microelectronic substrate and a distal portion capable of being raised from said first surface of said microelectronic substrate, wherein the distal portion defines at least one zone of attachment;
a first electrode film extending from one of said at least one zone of attachment and having a first electrical contact; and
a second electrode film attached to said elevating structure at the one of said at least one zone of attachment and having a second electrical contact, wherein the first and second electrode films are adapted for electrostatic actuation to controllably move relative to one another and provide for electrical connection between said first and second contacts.

38. A MEMS electrostatic optical attenuator comprising:
a microelectronic substrate having a first surface;
an elevating structure having a fixed portion attached to said first surface of said microelectronic substrate and a distal portion raised from said first surface of said microelectronic substrate, wherein the distal portion defines at least one zone of attachment;
a first electrode film extending from one of said at least one zone of attachment; and
a second electrode film attached to said elevating structure at the one of said at least one zone of attachment and having a reflective surface, wherein the first and second electrode films are adapted for electrostatic actuation to controllably move relative to one another for the purpose of altering optical beams that are proximate to said substrate.

39. A microelectromechanical (MEMS) apparatus, comprising:
a microelectronic substrate having a first surface;
an elevating structure having a fixed portion attached to said first surface of said microelectronic substrate and a distal portion capable of being raised from said first surface of said microelectronic substrate, wherein the distal portion defines at least one elevating structure zone of attachment;
a MEMS device attached to the distal portion of said elevating structure at the least one zone of attachment and defining at least one MEMS device zone of attachment; and
a secondary MEMS device attached to the MEMS device zone of attachment.

40. The MEMS apparatus of claim 39, wherein the secondary MEMS device defines at least one secondary MEMS device zone of attachment and said apparatus further comprises a tertiary MEMS device attached to the secondary MEMS device zone of attachment.

41. A microelectromechanical (MEMS) apparatus, comprising:
a microelectronic substrate having a first surface;
an elevating structure having a fixed portion attached to said first surface of said microelectronic substrate and a distal portion capable of being raised from said first surface of said microelectronic substrate, wherein the distal portion defines at least one zone of attachment; and
a MEMS electrostatic actuator having a first electrode film and a second electrode film, wherein said first and second electrode films are attached to said elevating structure at the at least one zone of attachment.

42. The MEMS apparatus of claim 41, wherein said first electrode film comprises a first electrode layer and at least one insulating layer.

43. The MEMS apparatus of claim 42, wherein said first electrode film further comprises at least one biasing layer.

44. The MEMS apparatus of claim 41, wherein said second electrode film comprises a second electrode layer and at least one insulating layer.

45. The MEMS apparatus of claim 44, wherein said second electrode film further comprises at least one biasing layer.

46. The MEMS apparatus of claim 41, wherein said second electrode film is more flexible than said first electrode film.

47. The MEMS apparatus of claim 46, wherein said second electrode film is positionally biased to curl generally away from the first electrode film prior to applying voltage.

48. The MEMS apparatus of claim 46, wherein said second electrode film is positionally biased to curl generally towards the first electrode film prior to applying voltage.

49. The MEMS apparatus of claim 41, wherein said first and second electrode films are positionally biased to curl in the same general direction.

50. The MEMS apparatus of claim 41, wherein said first and second electrode films are positionally biased to curl in generally opposite directions.

51. The MEMS apparatus of claim 41, wherein said first electrode film is an extension of said elevating structure.

52. The MEMS apparatus of claim 41, wherein said second electrode film is an extension of said elevating structure.

53. The MEMS apparatus of claim 41, wherein said first electrode film has a reflective surface capable of deflecting the path of a light beam.

54. The MEMS apparatus of claim 41, wherein said second electrode film has a reflective surface capable of deflecting the path of a light beam.

55. The MEMS apparatus of claim 41, wherein said first and second electrode films have reflective surfaces capable of deflecting the path of a light beam.

56. The MEMS apparatus of claim 41, wherein said elevating structure further comprises means for electrical communication between a source of electrical energy and the first and second electrode films.

57. The MEMS apparatus of claim 41, wherein said elevating structure is positionally biased so that the distal portion curves away from the first surface of said microelectronic substrate.

58. The MEMS apparatus of claim 41, wherein said at least one zone of attachment is generally parallel to the plane of the first surface of said microelectronic substrate.

59. The MEMS apparatus of claim 41, wherein said at least one zone of attachment is generally perpendicular to the plane of the first surface of said microelectronic substrate.

60. The MEMS apparatus of claim 41, wherein said at least one zone of attachment generally lies in a plane that is non-orthogonal to the plane of the first surface of the microelectronic substrate.

61. The MEMS apparatus of claim 1, wherein said distal portion of said elevating structure comprises a biased curled segment and a generally flat segment that follows said biased curled segment.

62. The MEMS apparatus of claim 61, wherein the generally flat segment lies in a plane generally perpendicular to the plane of said first surface of said microelectronic substrate.

63. The MEMS apparatus of claim 61, wherein the generally flat segment lies in a plane that is non-orthogonal to the plane of said first surface of said microelectronic substrate.

64. The MEMS apparatus of claim 61, wherein said flat segment of said distal portion has a generally rectangular shape that defines three zones of attachment.

65. The MEMS apparatus of claim 61, wherein said flat segment of said distal portion has a generally triangular shape that defines two zones of attachment.

66. The MEMS apparatus of claim 61, wherein said flat segment of said distal portion has a predetermined shape that defines more than one zones of attachment.

67. The MEMS apparatus of claim 41, further comprising a substrate electrode disposed on said microelectronic substrate and an elevating structure electrode disposed on said elevating substrate, wherein applying voltage to the substrate electrode and the elevating structure electrode actuates the elevating structure to alter the position of the elevating structure relative to said microelectronic substrate.

* * * * *

UNITED STATES PATENT AND TRADEMARK OFFICE
CERTIFICATE OF CORRECTION

PATENT NO.    : 6,456,420 B1
DATED         : September 24, 2002
INVENTOR(S)   : Goodwin-Johansson et al.

It is certified that error appears in the above-identified patent and that said Letters Patent is hereby corrected as shown below:

<u>Title page,</u>
Item [*] Notice, "Subject to any disclaimer, the term of this patent is extended or adjusted under 35 USC 154(b) by (58) days", delete the phrase "by 58 days" and insert -- by 0 days --

Signed and Sealed this

Fourteenth Day of October, 2003

JAMES E. ROGAN
*Director of the United States Patent and Trademark Office*